United States Patent [19]
Scarpa

[11] Patent Number: 5,487,186
[45] Date of Patent: Jan. 23, 1996

[54] AUTOMATIC FREQUENCY CONTROL USING SPLIT-BAND SIGNAL STRENGTH MEASUREMENTS

[75] Inventor: Carl G. Scarpa, Edison, N.J.

[73] Assignee: Hitachi America, Ltd., Tarrytown, N.Y.

[21] Appl. No.: 368,747

[22] Filed: Jan. 4, 1995

Related U.S. Application Data

[63] Continuation of Ser. No. 83,630, Jun. 28, 1993, abandoned.

[51] Int. Cl.$^6$ ........................................................ H04B 1/16
[52] U.S. Cl. .................................... 455/192.2; 455/182.2; 455/258; 375/344
[58] Field of Search ........................................ 375/344, 97

[56] References Cited

U.S. PATENT DOCUMENTS

| | | | |
|---|---|---|---|
| 4,523,324 | 6/1985 | Marshall | 375/97 |
| 4,896,336 | 1/1990 | Henely et al. | 375/97 |
| 5,150,382 | 9/1992 | Kume | 375/97 |
| 5,208,835 | 5/1993 | Weeks et al. | 375/97 |
| 5,251,218 | 10/1993 | Stone et al. | 455/324 |
| 5,282,227 | 1/1994 | Crawford | 455/258 |
| 5,289,506 | 2/1994 | Kitayama et al. | 375/97 |

FOREIGN PATENT DOCUMENTS 0300491  1/1989  European Pat. Off. .

*Primary Examiner*—Reinhard J. Eisenzopf
*Assistant Examiner*—Thanh Le
*Attorney, Agent, or Firm*—Peter L. Michaelson

[57] ABSTRACT

A technique for maintaining a center frequency of an input signal at a nominal center frequency. Apparatus which implements this technique divides, using a pair of bandpass filters (122, 124), the modulation bandwidth of the input signal into two halves (half-bands) and measures the signal strength of the input signal in each half-band. Then, circuitry (126, 128, 130), connected to each filter, compares the signal strengths of the signals passing through each filter. The circuitry produces a difference signal representing a difference between the strength of each signal passing through each respective filter. The difference signal is used to adjust a frequency of a local oscillator signal produced by a local oscillator (112) within a tuner (104) such that the center frequency of the input signal is maintained by the tuner at the nominal center frequency.

22 Claims, 5 Drawing Sheets

AUTOMATIC FREQUENCY CONTROL USING SPLIT-BAND SIGNAL STRENGTH MEASUREMENTS

CROSS REFERENCE TO RELATED APPLICATION

This application is a continuation of patent application serial number entitled "Automatic Frequency Control Using Split-Band Signal Strength Measurements", filed on Jun. 28, 1993 as 08/083,630, is now abandoned.

BACKGROUND OF THE DISCLOSURE

1. Field of the Invention

The invention relates to apparatus and methods for performing automatic frequency control in communications receivers and, particularly for performing automatic frequency control using split-band signal strength measurements.

2. Description of the Prior Art

In general, a communications receiver receives transmissions of modulated signals and reproduces information carried by those signals. Typically, each modulated signal is allocated a defined channel having a center frequency and a bandwidth. The modulated signal within the channel has a center frequency and modulation bandwidth, i.e., the spectral width of the modulation. Under user control, the receiver is tuned to a channel from which the user wishes to receive information. In practice, such tuning involves initially tuning the receiver to receive a modulated signal centered at the channel center frequency. However, in many instances, the modulated signal is not precisely centered at the center frequency of the channel. If the modulated signal is not centered within the channel and the receiver contains an automatic frequency control circuit, the receiver adaptively retunes itself to compensate for the frequency offset of the modulated signal. Consequently, the modulated signal automatically becomes centered in the channel. As discussed below, circuitry for adaptively tuning the receiver is costly and complex.

In general, a conventional analog communications receiver for receiving and demodulating modulated signals contains a tuner, a demodulator and an automatic frequency control (AFC) circuit. Typically, the tuner is user controllable to enable individual channels to be selected for demodulation. After a channel is selected by the tuner, the demodulator demodulates the modulated signal within that channel. The demodulator also detects any frequency offset of the modulated signal center frequency from the channel center frequency. The AFC circuit compensates for such frequency offset. If the offset is not compensated, the demodulation process is not optimally accomplished. Consequently, any information thereby reproduced may be distorted.

The input lead of the tuner is typically connected to a transducer such as an antenna, photodiode, and the like, to convert electromagnetic energy into an electric signal. Alternatively, such a transducer may not be used and a cable transmission may be connected directly to the input lead of the tuner. For simplicity, I will assume, for the following discussion, that the receiver is utilized for over-the-air radio-frequency (RF) broadcasts such as conventional television or radio signals. Therefore, the transducer is an antenna and a signal received from the antenna is hereinafter referred to as a radio-frequency (RF) signal. Such an RF signal is defined by a center frequency and a modulation bandwidth, i.e., the spectral width of modulation carried by the RF signal.

Specifically, the tuner contains circuitry, connected to the antenna, for "down-converting" the RF signal from a relatively high center frequency to a lower center frequency. The circuitry utilized for performing the down-conversion is generally known in the art as an IF stage. Specifically, the IF stage contains a mixer, connected to the antenna, which "down-converts" the RF signal (lowers the center frequency of the RF signal) to an intermediate frequency (IF) thereby generating a so-called IF signal. After down-conversion, the modulation of the RF signal is centered at the intermediate frequency.

A mixer accomplishes down-conversion by mixing a local oscillator signal with the RF signal to produce the IF signal. To enable demodulation of information carried by different RF signals having different center frequencies, i.e., different channels, while maintaining a single center frequency for the IF signal, the frequency of the local oscillator is tunable. If more than one IF stage is used, typically, the first stage, i.e., the stage connected directly to the antenna, contains the tunable local oscillator.

More specifically, the RF signal from the antenna is "mixed" with a local oscillator (LO) signal to produce signals having center frequencies equal to the sum of the RF and LO frequencies, the difference of the RF and LO frequencies and various harmonics of the RF and LO frequencies. Typically, to achieve a low valued center frequency for the IF signal, an IF filter selects the difference signal as the IF signal to be demodulated. Initially, the LO frequency is tuned to enable an RF signal centered at the channel center frequency to be down-converted to an IF signal centered in the passband of the IF filter. However, if the center frequency of the RF signal is not equivalent to the center frequency of the channel, the IF signal will not be centered in the passband of the IF filter. Accordingly, the LO frequency is retuned by the AFC circuit to center the IF signal. In particular, to maintain a constant center frequency for the IF signal while the center frequency of the RF signal varies, the frequency of the LO signal varies with changes in the center frequency of the RF signal. In this manner, the difference frequency is maintained at the center frequency of the IF signal. As such, to maintain a constant center frequency for the IF signal, the frequency of the LO signal must be accurately and adaptively tuned during changes (drift) in the center frequency of the RF signal. The retuning of the LO frequency is accomplished by frequency control circuits. These circuits are typically contained within the demodulator.

A demodulator, connected to the IF filter, demodulates the IF signal to recover information from the modulation contained in this signal. In some instances, the receiver contains a second IF stage to further lower the frequency of the IF signal before demodulation. Additionally, as is well-known in the art, each IF stage may contain amplifiers, filters, limiters, and the like to facilitate the down-conversion. Because implementation of these circuits is conventional in the art and varies with each receiver application, I will not discuss them in any detail.

Conventional analog frequency control circuits, such as those used in conventional television or radio receivers, rely on the fact that a carrier (pilot tone) is present in the RF signal. Typically, the carrier is fixed relative to the modulation bandwidth. As such, the position (frequency) of the carrier within the IF passband serves as an indicator of the position of the IF signal within the IF passband. To use this indicator, the frequency control circuits search for the carrier within the IF signal. Typically, the search is accomplished by a conventional phase lock loop circuit. Once the carrier signal is found and locked upon, the demodulator also frequency locks to the carrier signal and proceeds to demodulate the IF signal.

In contrast to the foregoing description of a conventional analog receiver, digital communications systems, in general, do not broadcast a carrier signal along with the modulated RF signal. In fact, most digital communications systems intentionally suppress carrier signals in an effort to conserve spectral energy.

In general, digital communications receivers utilize the same circuitry as analog receivers. Specifically, digital receivers contain a tuner, a frequency control circuit and a demodulator. However, receivers for receiving digital broadcasts, such as high definition television (HDTV) broadcasts, typically include complex demodulator circuitry that demodulates information in the received signal and uses that information, or a portion thereof, to control the LO frequency of a local oscillator in the tuner. Generally, these circuits are known as carrier recovery circuits. Specific, well-known examples of such carrier recovery circuits include Costas loops, delay lock loops, and the like. Detrimentally, these circuits tend to accurately operate only when the center frequency of the received RF signal is within a relatively narrow frequency range, i.e., a frequency range known as a capture range. Specifically, capture range is the range of frequencies in which the center frequency of the RF signal must lie within in order to enable the demodulator to accurately control the frequency of the LO signal. Whenever the center frequency is outside the capture range, the demodulator can not accurately demodulate the IF signal. As a result, the carrier recovery circuit can not generate an accurate LO frequency control signal that will center the IF signal in the IF filter passband. Therefore, receivers for applications where the center frequency of RF signal may fall or drift outside of the capture range of the carrier recovery circuit contain further circuitry that maintains the center frequency of the IF signal within the capture range of the demodulator. Typically, such circuitry conducts orchestrated IF signal searches. These searches are performed by tuning the frequency of the LO signal in a logical pattern until the IF signal is frequency locked by the carrier recovery circuit. Such circuits contain search algorithms for performing the logical search. These search algorithms tend to incrementally scan the frequency of the LO signal until the carrier recovery circuitry achieves frequency lock, i.e., the center frequency of the IF signal is within the capture range of the carrier recovery circuit. Though search circuits and their concomitant search algorithms operate well in most receivers, these circuits add to receiver cost and complexity. Additionally, these circuits require relatively long periods of time to acquire lock of the IF signal. As such, during the acquisition time the receiver cannot demodulate the transmission and, consequently, a significant amount of information can be lost.

Therefore, a need exists in the art for an economical and simple technique that can quickly tune the frequency of an LO signal to a frequency which positions the center frequency of the IF signal within the capture range of a demodulator and which, to accurately tune the LO signal, does not require a carrier (pilot tone) in the RF signal.

SUMMARY OF THE INVENTION

My invention advantageously overcomes the disadvantages heretofore associated with receivers that require tuner scanning to achieve frequency lock. Specifically, to overcome these disadvantages my invention provides automatic and continuous frequency control using split-band signal strength measurements.

In general, my inventive technique maintains a center frequency of an input signal to a receiver within the capture range of a demodulator that will demodulate the input signal. Apparatus which implements my inventive technique using two filters that divide a modulation bandwidth of the input signal into two halves, i.e., into two so-called "half-bands" and measures the signal strength in each half-band. Then, the apparatus compares the signal strength in each half-band and generates a difference signal representing the difference between these strengths. Simply put, the difference signal represents the relative signal strengths of the signals passing through each filter. As such, the difference signal indicates the degree to which the input signal is offset from a nominal center frequency. The difference signal is used to adjust a frequency of a local oscillator within a tuner such that the tuner maintains the center frequency of the input signal within the capture range of the demodulator, i.e., at, or near, the nominal input signal center frequency.

More specifically, my inventive technique is incorporated into a receiver such as a radio or television receiver, and utilizes a conventional tuner containing a bandpass filter, mixer, intermediate frequency (IF) filter, and a local oscillator. Typically, the bandpass filter is connected between an antenna, or some other signal source that provides a radio-frequency (RF) input signal, and the mixer. Also connected to the mixer is the local oscillator (LO) that provides an LO signal. The mixer combines the RF signal and the LO signal to produce an intermediate frequency (IF) signal and various harmonics. The IF filter, connected to the output of the mixer, removes the harmonics and produces the IF signal. This IF signal forms an input to my inventive circuit.

To produce two half-bands, my invention uses an upper half-band filter and a lower half-band filter. The IF signal forms an input to each half-band filter. Each filter is a bandpass filter having a bandwidth approximately equivalent to half the bandwidth of the modulation associated with the IF signal. Hereinafter, this bandwidth is referred to as the modulation bandwidth. Circuitry connected to the output of each filter produces signals that indicate the signal strength of the filter output signals. This circuitry typically produces a signal having an amplitude that represents the power of each signal, but may also represent the magnitude (absolute value) of each signal. In either case, a subtractor, connected to the output of each filter, compares the signal strengths. The subtractor produces a difference signal which, after filtering and scaling, is used to control the frequency of the local oscillator signal.

Using my inventive technique, the difference signal varies as the IF signal drifts (changes) from its nominal center frequency. Specifically, as the center frequency of the IF signal moves from a nominal center frequency, e.g., the center of the capture range of a demodulator in the receiver, the signal strength from one half-band filter will become smaller than the signal strength from the other half-band filter. As such, the magnitude of the difference signal increases. Furthermore, the sign of the difference signal depends upon the direction of the frequency shift of the IF signal. The difference signal is used in a filtered and scaled form to continuously adjust the LO frequency to tune the center frequency of the IF signal to the nominal center frequency. The IF signal is therefore maintained at a position which achieves optimum demodulation.

In one embodiment of the invention, the difference signal produced by my invention is used as a coarse tune signal and, a demodulator produces, in a conventional manner, a fine tune signal. The coarse tune signal controls the frequency of the local oscillator until the center frequency of the IF signal is within the capture range of the demodulator. Once the center frequency of the IF signal is within this capture range, the demodulator produces a lock signal which instructs a coarse/fine tune selection circuit to select the fine tune signal from the demodulator as the frequency control signal of the local oscillator. In this manner, my inventive apparatus coarsely tunes the IF signal to a frequency within the capture range of the demodulator; the demodulator fine tunes the center frequency of the IF signal to achieve alignment with the nominal center frequency.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

My invention can be implemented using either digital or analog circuitry. Additionally, the digital circuitry can be implemented using either hardware or software. Using any of the possible implementations, the inventive technique is useful in many types of communications receivers including radio, broadcast television, cable television, fiber optic, and the like. The following detailed description of my inventive technique contains an illustrative example of the technique as it would be implemented as digital circuitry. In particular, the technique is presented in the context of an examplary digital implementation in a high definition television (HDTV) receiver. However, those skilled in the art will readily recognize the many other uses of the inventive technique in other forms of receivers.

Figure 1:
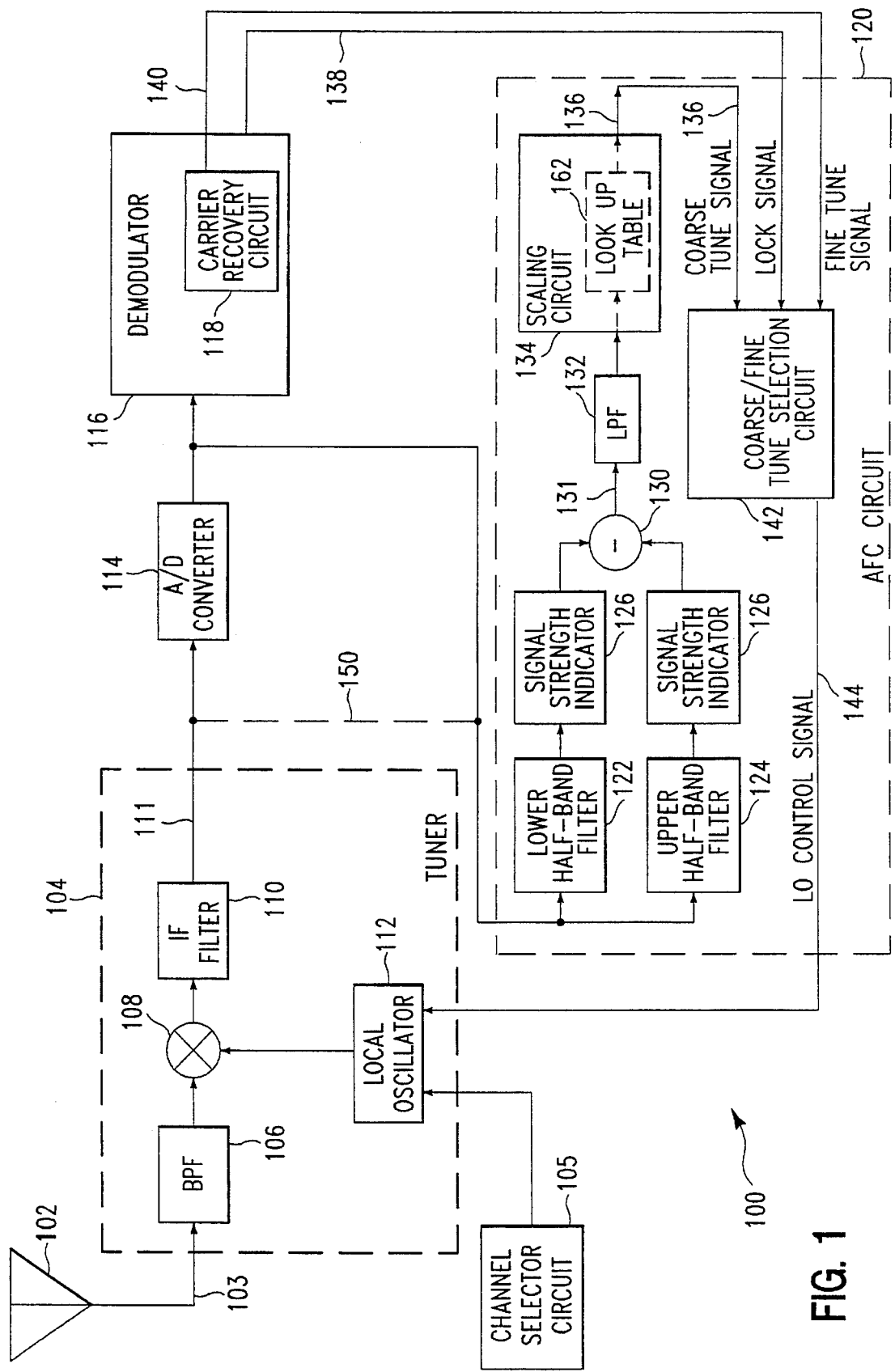
FIG. 1 depicts a block diagram of my inventive apparatus for providing automatic frequency control in digital communications receiver 100.

FIG. 1 depicts a block diagram of a digital communications receiver incorporating my inventive technique for automatically and continuously controlling a center frequency of an intermediate frequency (IF) signal. In general, a digital communications receiver receives a digitally modulated radio frequency (RF) signal from an antenna, down-converts the RF signal to an IF signal having the same modulation as the RF signal but having a different (typically lower) center frequency. Subsequently, the receiver demodulates the IF signal to recover information contained in the modulation. A demodulator accurately functions only if the IF signal is positioned at, or near, a nominal center frequency. Accordingly, a tuner, located between the antenna and the demodulator, ensures that the IF signal has a relatively constant center frequency no matter what the frequency of the RF signal.

Specifically, receiver 100 receives, on lead 103, RF signals from antenna 102. Of course, the antenna could be replaced with another form of signal source such as a cable, optical fiber coupled to an electro-optic transducer and the like. The RF signals from antenna 102 have an arbitrary center frequency and a modulation bandwidth defined by a symbol transmission rate and a type of modulation then being used, i.e., frequency shift key (FSK), quadrature amplitude modulation (QAM) or the like. The receiver contains tuner 104, channel selector circuit 105, A/D converter 114, demodulator 116 and automatic frequency control (AFC) circuit 120. In operation, a user selects a channel from which information is to be demodulated using conventional channel selector circuit 105. In response, tuner 104 initially down-converts an RF signal, within the selected channel to produce an IF signal, on lead 111. AFC circuit 120 senses any frequency offset of the IF signal from the nominal center frequency. If a frequency offset is sensed, the AFC circuit produces, on line 144, a control signal that causes the tuner to position the center frequency of the IF signal at the nominal center frequency. As such, once the IF signal is accurately positioned, demodulator 116 accurately demodulates the IF signal.

In a simple illustrative form, tuner 104 contains bandpass filter 106, mixer 108, local oscillator 112 and IF filter 110. Bandpass filter 106 limits the noise bandwidth of the receiver by filtering the RF signals on lead 103. The specific bandwidth, which is not critical here, of filter 106 depends upon the application for the receiver. Mixer 108, connected to bandpass filter 106 and local oscillator 112, mixes a variable frequency signal from local oscillator (LO) 112 with the RF signals that pass through filter 106 to produce many IF signals (one for each channel having an RF signal therein) and a number of harmonic signals. IF filter 110, connected to an output of mixer 108, suppresses the harmonic signals and the unwanted IF signals and passes, to lead 111, the IF signal associated with a selected channel. The selected channel corresponds to the frequency of the present LO signal. The primary purpose of such a tuner is to facilitate reception of many channels and to down-convert the RF signal in a selected channel using a variable frequency local oscillator (LO) signal. It is the frequency of this local oscillator signal that my inventive technique controls.

In operation, illustrative tuner 104 combines the RF signal and the LO signal using mixer 108. Since it is understood that the IF filter removes all IF signals that do not correspond to the channel which a user has selected, hereinafter the term "RF signal" refers to only the RF signal in the selected channel. The combined signals produce various frequency component signals including an upper sideband IF signal, i.e., an IF signal formed from a sum of the LO signal and the RF signal, and a lower sideband IF signal, i.e., an IF signal formed from a difference of the LO signal and the RF signal. The resultant signal frequencies from a typical signal mixing process are represented by equation (1) as follows:

$$f_{LO} \otimes f_{RF} = (f_{RF} - f_{LO}) + (f_{RF} + f_{LO}) + 2f_{RF} + 2f_{LO} + f_{RF} + f_{LO} + 3f_{RF} + 3f_{LO} + (2f_{RF} \pm f_{LO}) + (2f_{LO} \pm f_{RF}) \quad (1)$$

where:

$f_{RF}$ is the center frequency of the RF signal;

$f_{LO}$ is the frequency of the LO signal;

$(f_{RF}-f_{LO})$ is the center frequency of the lower sideband IF signal; and $(f_{RF}+f_{LO})$ is the center frequency of the upper sideband IF signal.

IF filter 110 selects one of the sidebands as the IF signal. Typically, for reasons well-known in the art and irrelevant to understanding my invention, the IF filter selects the lower sideband signal. To properly filter the output of mixer 108 and select the lower sideband IF signal, the IF filter has a passband bandwidth equal to or slightly greater than the modulation bandwidth of the RF signal and has a center frequency equal to $(f_{RF}-f_{LO})$, hereinafter referred to as a "nominal" center frequency.

To facilitate digital processing of the IF signal, analog-to-digital (A/D) converter 114 converts the analog IF signal into a digital bit stream (hereinafter referred to as the digital IF signal). The conversion rate and the conversion accuracy of the A/D converter are well known design parameters that must be selected to accommodate the modulation bandwidth of the analog IF signal.

The digital IF signal forms an input to demodulator 116. The demodulator performs digital signal processing upon the digital IF signal to recover information contained within the modulation. The demodulator only functions properly if the digital IF signal is substantially centered at the nominal IF signal center frequency. For instance, if the RF signal center frequency $(f_{RF})$ drifts to another frequency or is intentionally offset by a broadcaster defined frequency offset $(f_{OS})$ from the RF center frequency, e.g., to $(f_{RF}+f_{OS})$, then the center frequency of the IF signal becomes $(f_{RF}-f_{LO}+f_{OS})$. As such, the digital IF signal is not centered within the IF filter; resulting in IF signal distortion. Additionally, the frequency offset may be large enough such that the center frequency of the digital IF signal is outside of the capture range (discussed below) of the demodulator. As a result, the demodulator will not accurately demodulate the IF signal. To remedy any detrimental effects of this frequency offset, the LO signal frequency must be tuned to $(f_{LO}-f_{OS})$. Once the LO signal is so tuned, the digital IF signal will be centered in the IF filter passband and within the capture range of the demodulator.

Typically, demodulator 116 contains conventional carrier recovery circuit 118 that generates a control signal for local oscillator 112. As is well-known in the art, a Costas loop demodulator creates an error signal that can be used to tune a voltage controlled oscillator (local oscillator) to ensure that the center frequency of the IF signal is maintained at the nominal center frequency. However, for a Costas loop to produce such a control signal, the center frequency of the IF signal must lie within a limited offset from the nominal center frequency. Such a limited offset is known in the art as a capture range. Unfortunately, the capture range of such Costas loop circuits is typically on the order of tens of kilohertz. As such, if the center frequency of the digital IF signal is, or becomes, offset by more than the capture range of the demodulator, the demodulator can not adjust the frequency of the local oscillator to fully compensate for the offset.

My inventive automatic frequency adjusting technique advantageously remedies this deficiency both economically and simply. In general, my inventive technique "coarsely" tunes the frequency of the local oscillator such that the center frequency of the digital IF signal remains within the capture range of the demodulator. Thereafter, the demodulator, to the extent necessary, "fine" tunes the frequency of the local oscillator. In this manner, the frequency of the LO signal becomes "frequency locked" to the RF signal over a relatively wide range of frequencies.

In particular, my inventive technique is implemented in AFC circuit 120. The AFC circuit contains bandpass filters 122 and 124, signal strength indicators 126 and 128, subtractor 130, low pass filter 132, scaling circuit 134 and coarse/fine tune selection circuit 142. Specifically, my inventive technique uses two bandpass filters 122 and 124 having different center frequencies. These filters are connected in parallel to the output of A/D converter 114. Ideally, each filter has a bandwidth equivalent to one-half the modulation bandwidth of the RF signal and rolloff with an infinite slope. Additionally, the center frequency of the passband of each filter is respectively located at a frequency one-quarter the bandwidth of the modulation bandwidth above and one-quarter the bandwidth of the modulation bandwidth below the center frequency of the digital IF signal. In this manner, one filter has a bandpass bandwidth corresponding to the upper half-band of the modulation bandwidth (hereinafter referred to as upper half-band filter 124) and the other filter has a bandpass bandwidth corresponding to the lower half-band of the modulation bandwidth (hereinafter referred to as lower half-band filter 122). A discussion of the practical implementation of these filters appears below. For now and to simplify the following discussions, the filters will be assumed to be ideal, i.e., having a bandwidth of exactly one-half the modulation bandwidth and a rolloff having an infinite slope.

Circuits 126 and 128, connected to an output of filters 122 and 124, respectively, produce output signals which indicate the signal strength of the signals passed through each filter. Illustratively, circuits 126 and 128 are squaring circuits which respectively produce output signals that are the instantaneous square of the signals at the output of each filter 122 and 124. Alternatively, each squaring circuit could be replaced with a circuit that generates an absolute value signal representing the absolute value (magnitude) of the output signal from each of the filters. In either case, circuits 126 and 128 produce signals that represent the signal strength of signals within the passband of filters 122 and 124.

Subtractor 130, connected to circuits 126 and 128, produces a difference signal on lead 131 representing the difference between the output of circuit 126 and the output of circuit 128. Typically, circuits 126 and 128 produce harmonics of their input signals and noise. Therefore, low pass filter (LPF) 132, connected to subtractor 130, appropriately filters the subtractor output. The magnitude and sign of the difference signal indicate whether the modulation bandwidth of the digital IF signal is centered at the nominal center frequency. For instance, if the center frequency of the digital IF signal is offset to a lower (higher) frequency than the nominal frequency, the strength of a signal passing through the upper half-band filter is less (greater) than the strength of a signal passing through the lower half-band filter. As such, the output from LPF 132 is a DC value having a negative (positive) sign and a magnitude representing the amount of frequency offset. The magnitude and sign of the difference signal are used to continuously adjust the local oscillator frequency to maintain the digital IF signal at the nominal center frequency. In contrast, when the digital IF signal is centered at the nominal center frequency, the difference signal is zero. Scaling circuit 134, typically a linear amplifier, scales the difference signal to produce a voltage level for the LO control signal that is appropriate for controlling the local oscillator. The output of circuit 134, on line 136, is a so-called "coarse" tune signal.

Coarse/fine adjustment selection circuit 142 operates in response to signals from demodulator 116. Circuit 142 selects either a coarse tune signal, on line 136, from scaling circuit 134 or a fine tune signal, on line 140, from carrier recovery circuit 118. When the digital IF signal can not be demodulated, i.e., the digital IF signal is outside the capture range of the demodulator, the demodulator informs, via line 138, circuit 142 that frequency lock can not be achieved. Illustratively, line 138 carries a "lock" signal having a high level to indicate that lock is achievable and a low level to indicate that lock is not achievable. In response to a low-level lock signal, circuit 142 selects the coarse tune signal as the local oscillator control signal on line 144. As such, the coarse tune signal adjusts the frequency of the local oscillator such that the center frequency of the digital IF signal moves into the capture range of the demodulator. The demodulator then informs circuit 142 that frequency lock is achievable by changing the lock signal to a high level. In response, circuit 142 selects the fine tune signal as the LO control signal. As such, the carrier recovery circuit produces, using a conventional manner, the fine tune signal to control the frequency of the local oscillator.

One application for my inventive technique is within a high definition television (HDTV) receiver. Most of the broadcast standards for HDTV currently being considered by the Federal Communications Commission (FCC) are digital broadcasts which do not transmit carrier signals. As such, my inventive technique is particularly useful for coarse tuning the HDTV receiver.

In particular, one form of HDTV broadcasts transmits either 16-ary or 32-ary quadrature amplitude modulated (QAM) signal within a channel having an approximate bandwidth of 6 MHz. The modulation bandwidth of the RF signal is approximately 6 MHz and, ideally, should be centered in the channel bandwidth. Specifically, the bandwidth has a 3 dB bandwidth of 5 MHz and transition bandwidths of 500 KHz. Upon down-conversion, the IF signal also has a modulation bandwidth of approximately 6 MHz. However, frequency drift of the transmitted signal and/or intentional RF signal frequency offset by a broadcaster can result in the RF signal being offset from its typical center frequency within the channel.

In such an HDTV application, a practical implementation of the upper half-band and lower half-band filters contained in my invention has 3 dB passband bandwidths of 1.5 MHz and transition bandwidths of 500 kHz. The center frequency of each filter is offset from the center frequency of the IF signal by 1.25 MHz, i.e. one-quarter of the transmitted symbol rate for 16-ary or 32-ary QAM. Illustratively, the center frequency of the IF signal is 5 MHz. As such, the lower half-band filter has a center frequency of 3.75 MHz and the upper half-band filter has a center frequency of 6.25 MHz.

These filters can be implemented as digital filters such as finite impulse response (FIR) filters or infinite impulse response (IIR) filters. Illustratively, a conventional FIR filter having 65 taps can be implemented to have the filtering characteristics described above. To achieve these filtering characteristics, each of the 65 taps is weighted by a specific numerical coefficient. For example, the lower half-band filter uses the coefficients appearing in Table 1.

TABLE 1

Illustrative weighting values for a lower half-band FIR filter

| | | | |
|---|---|---|---|
| $h(1) = $ −.0106 | $h(9) = $ −.0155 | $h(17) = $ −.0296 | $h(25) = $ −.0436 |
| $h(2) = $ .0004 | $h(10) = $ −.0059 | $h(18) = $ −.0135 | $h(26) = $ −.0271 |
| $h(3) = $ .0021 | $h(11) = $ .0086 | $h(19) = $ .0260 | $h(27) = $ .0692 |
| $h(4) = $ −.0055 | $h(12) = $ .0063 | $h(20) = $ .0315 | $h(28) = $ .1148 |
| $h(5) = $ .0003 | $h(13) = $ .0003 | $h(21) = $ .0003 | $h(29) = $ .0002 |
| $h(6) = $ .0100 | $h(14) = $ .0060 | $h(22) = $ −.0155 | $h(30) = $ −.1578 |
| $h(7) = $ .0099 | $h(15) = $ .0108 | $h(23) = $ −.0001 | $h(31) = $ −.1318 |
| $h(8) = $ −.0061 | $h(16) = $ −.0090 | $h(24) = $ −.0079 | $h(32) = $ .0751 |
| | | | $h(33) = $ .2016 |

These coefficients are representative of the values used for half of the taps, i.e., taps 1 through 33, that comprise the filter. The remaining taps, e.g., taps 34 through 65, have respectively identical coefficients to coefficients h(32) through h(1) shown in Table 1. In other words, the filter coefficients are symmetric about the h(33) value.

The upper half-band filter includes a similar set of coefficients as those in Table 1. Specifically, Table 2 contains a set of coefficients for an upper half-band filter.

TABLE 2

Illustrative weighting values for an upper half-band FIR filter

| | | | |
|---|---|---|---|
| $h(1) = $ −.0106 | $h(9) = $ −.0155 | $h(17) = $ −.0295 | $h(25) = $ −.0436 |
| $h(2) = $ −.0004 | $h(10) = $ .0059 | $h(18) = $ .0135 | $h(26) = $ .0271 |
| $h(3) = $ −.0021 | $h(11) = $ .0086 | $h(19) = $ .0260 | $h(27) = $ .0693 |
| $h(4) = $ .0055 | $h(12) = $ −.0063 | $h(20) = $ −.0314 | $h(28) = $ −.1148 |
| $h(5) = $ .0003 | $h(13) = $ .0003 | $h(21) = $ .0003 | $h(29) = $ .0003 |
| $h(6) = $ −.0100 | $h(14) = $ −.0060 | $h(22) = $ .0155 | $h(30) = $ .1578 |
| $h(7) = $ .0099 | $h(15) = $ .0108 | $h(23) = $ −.0001 | $h(31) = $ −.1318 |
| $h(8) = $ .0062 | $h(16) = $ .0091 | $h(24) = $ .0079 | $h(32) = $ −.0751 |
| | | | $h(33) = $ .2016 |

As with the lower half-band filter, the coefficients of the upper half-band filter are symmetric about coefficient h(33). Therefore, only coefficients h(1) through h(33) are shown in Table 2.

By using filter center frequencies that are one-quarter the symbol rate above and below the nominal center frequency of the IF signal, the magnitude of the filter coefficients for both filters are essentially identical. However, the sign of every other coefficient in Table 2 is opposite that of a corresponding coefficient in Table 1. Those skilled in the art will quickly realize that such coefficient correspondence allows for economical implementation and manufacture of the two filters.

FIR filters can be implemented in well-known fashions in either software or hardware. Whether a hardware or software implementation is ultimately used depends upon the application for the receiver into which the invention is to be incorporated.

Figure 2:
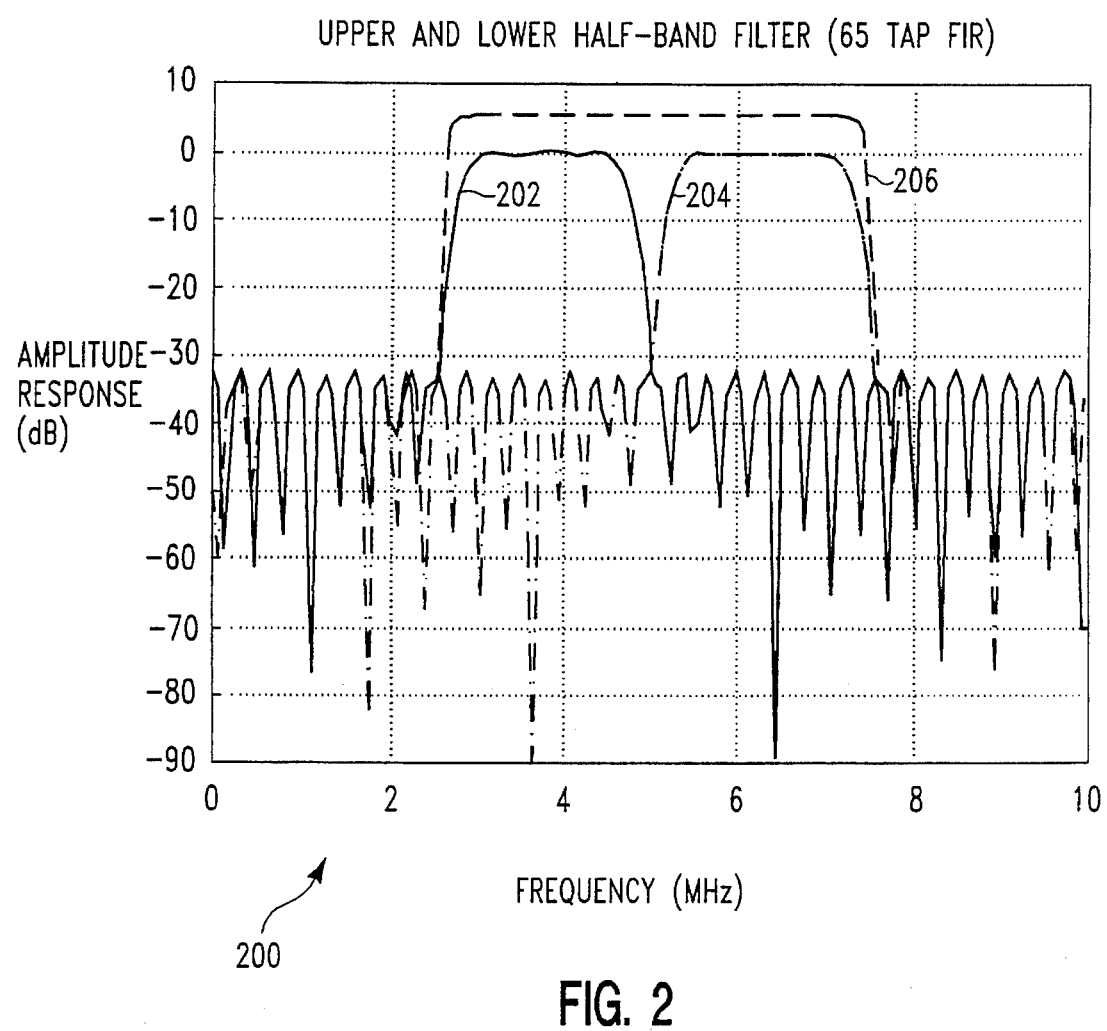
FIG. 2 depicts graph 200 of the passband frequency responses of filters 122 and 124 depicted in FIG. 1 overlaid with typical frequency spectrum 206 of a high definition television (HDTV) quadrature amplitude modulated (QAM) signal.

FIG. 2 depicts graph 200 of the passband frequency responses for the 65-tap FIR filters discussed above, i.e., lower half-band filter response 202 and upper half-band filter response 204. Superimposed over the graph of the passband frequency responses is frequency spectrum 206 of a typical QAM HDTV signal. As shown, the signal is centered within the IF bandwidth, e.g., approximately a 6 MHz bandwidth at a center frequency of 5 MHz.

With a centered IF signal, the signal strength measured at the output of each filter (filters 122 and 124 shown in FIG. 1) will be substantially equal. Consequently, the difference signal is zero. Thus, the frequency of the local oscillator is not adjusted. Consequently, the fine tune signal produced by the demodulator is used to control the local oscillator. However, if the IF signal becomes offset from its center frequency, the signal strength measured at the output of each filter will become unequal. As such, the receiver selects the coarse tune signal to adjust the frequency of the local oscillator.

Figure 3:
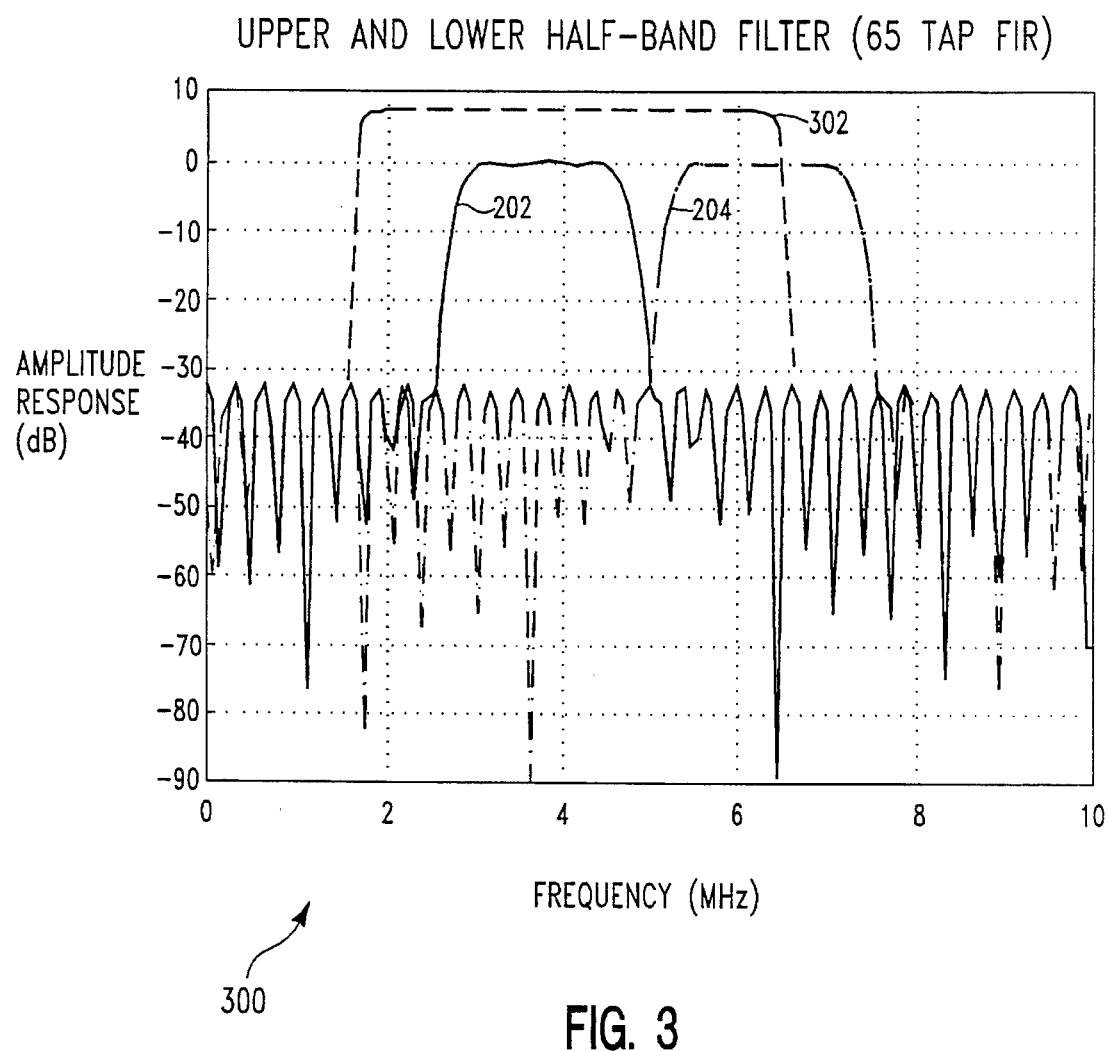
FIG. 3 depicts graph 300 of the passband frequency responses of filters 122 and 124 depicted in FIG. 1 overlaid with a typical frequency spectrum 206 of an HDTV QAM signal having a frequency offset of 1 MHz.

FIG. 3 depicts graph 300 of frequency spectrum 302 having a frequency offset of −1 MHz from the nominal IF center frequency. With this illustrative offset, lower half-band filter passband response 202 is fully encompassed by signal spectrum 302 while upper half-band filter passband response 204 is only partially encompassed by signal spectrum 302. Consequently, the signal strength indicated at the output of the lower half-band filter exceeds that appearing at the output for the upper half-band filter. The magnitude of the resulting difference signal indicates the amount of the frequency offset; the sign of the difference signal indicates the direction of the offset. Using the sign and amplitude of the difference signal, the invention controls the frequency of the local oscillator to center the IF signal at its nominal center frequency. In this instance, the AFC circuit produces a coarse tune signal that would adjust the frequency of the LO signal until the difference signal becomes substantially zero. At that point, the IF signal would once again be centered at the nominal center frequency.

Figure 4:
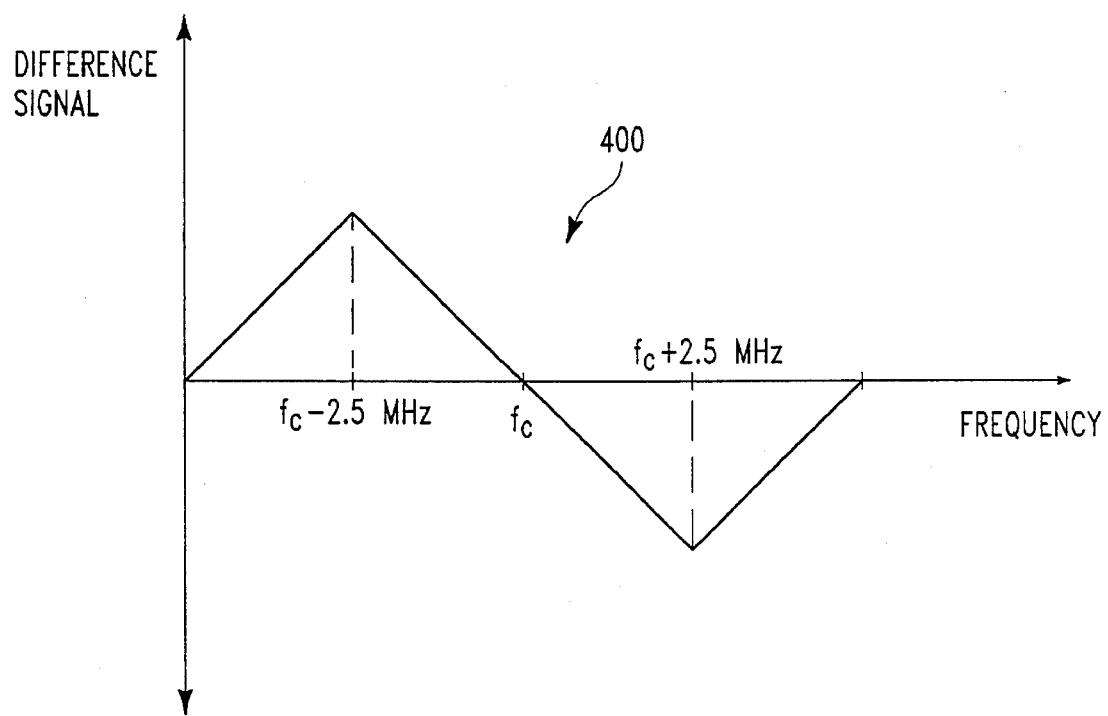
FIG. 4 depicts graph 400 of a difference signal versus frequency for the apparatus shown in FIG. 1 when using filters having passband frequency responses as shown in FIG. 2.

FIG. 4 depicts graph 400 of the difference signal versus center frequency for a QAM HDTV signal. Graph 400 is linear over a range of plus or minus half the modulation bandwidth, e.g., ±2.5 MHz, about the nominal center frequency ($f_c$) of the modulation bandwidth. This range is the capture range of my inventive technique. Within this range, the magnitude and sign of the difference signal uniquely define a frequency offset of the IF signal which is used to tune the frequency of the local oscillator. As such, as long as the RF signal has a center frequency within this capture range, my inventive technique can adjust the frequency of the local oscillator to center the IF signal at the nominal center frequency ($f_c$). Once the digital IF signal is substantially centered, the demodulator can frequency lock to the IF signal and produce a lock signal. The lock signal instructs the coarse/fine tune selection circuit to utilize the fine tune signal as the local oscillator control signal.

In some applications, RF signals in adjacent channels may drift into the passband of either the upper or lower half-band filter. The adjacent RF signal that so drifted would add signal strength to the IF signal passing through one of the half-band filters. Consequently, the difference signal would not accurately reflect the offset, if any, of the IF signal. To correct this potential problem, the bandwidth of the half-band filters is reduced and the center frequency of each filter is moved toward the nominal center frequency. The specific amount of alteration to the filters depends upon the expected amount of adjacent signal drift. The extent of such alterations must ensure that for the expected worst-case drift, no energy from the adjacent RF signal enters the passband of either half-band filter. Consequently, the capture range of my invention is reduced by the amount of filter alteration.

In some applications for my inventive technique, the frequency spectrum of the RF signal modulation may be asymmetric about the center frequency, e.g., the frequency spectrum of the modulation may contain frequency notches or more energy in one portion of the spectrum than other portions. Such asymmetric signals include such HDTV signals as spectrally shaped QAM (SSQAM), 4-vestigial sideband (4-VSB) and the like. For such asymmetrical modulation, a curve of the difference signal versus center frequency is typically non-linear. Additionally, the difference signal which results when the modulation is centered is typically not zero. To accommodate these non-linearities, scaling circuit 134 can perform a mapping function. In a simple form, the mapping function is accomplished by a conventional look-up table. In general, the difference signal is used as an address into the table (such as look-up table 162 shown in dashed lines in FIG. 1) to recall a value for the local oscillator control signal. The recalled value is used to appropriately adjust the frequency of the local oscillator to the nominal center frequency of the IF signal.

Additionally, for some asymmetrical frequency spectrums of RF signal modulation, the passband of each half-band filter can be shaped to compensate for the asymmetries in the RF signal. For example, if an RF signal contains more energy at lower frequencies in its modulation bandwidth than in its upper frequencies, the lower half-band filter can be shaped to attenuate the IF signal at those lower frequencies. Consequently, when the IF signal is centered at the nominal center frequency, the difference signal is zero. With shaped filters, my inventive apparatus will operate as described above with respect to a symmetric RF signal.

Additionally, my inventive technique can be implemented using conventional analog rather than digital circuitry. In doing so, the output of the IF filter forms the input to the AFC circuit, i.e., the input is the IF signal before the A/D converter. Such a signal route is shown as dashed line 150 in FIG. 1. The AFC circuit is implemented using well-known analog circuitry in place of the digital circuitry discussed above.

Figure 5:
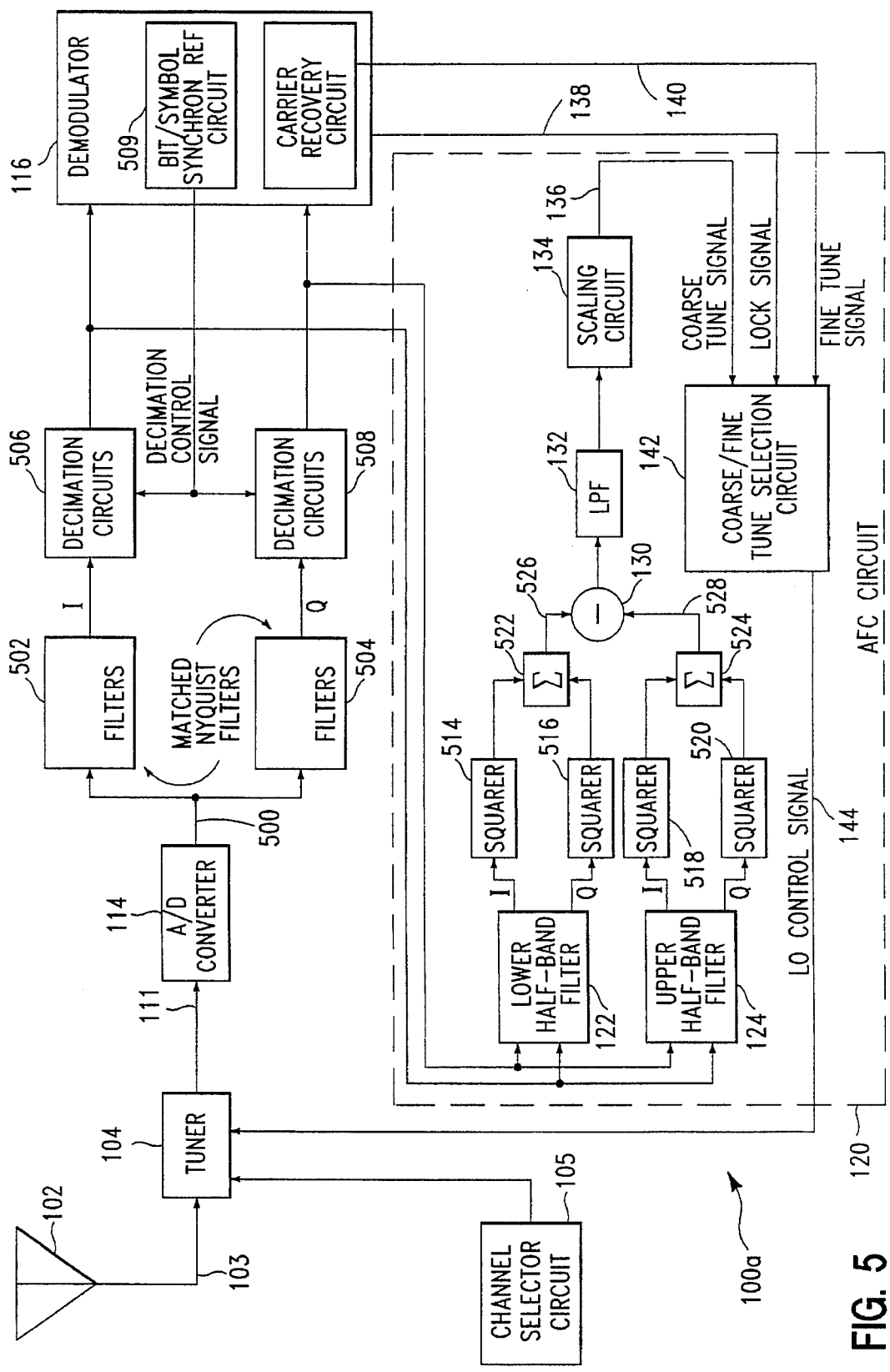
FIG. 5 depicts a block diagram of an alternative embodiment of my inventive apparatus for providing automatic frequency control using complex filtering in digital communications receiver 100.

FIG. 5 depicts an alternative embodiment of my invention. In this embodiment, the half-band filtering is accomplished in the complex domain rather than the real domain used in the previously described embodiment. In digital communication receiver 100a the digital IF signal, on line 500, is filtered by matched Nyquist filters 502 and 504. An output signal from filter 502 is an in-phase (I) signal and an output signal from filter 504 is a quadrature-phase (Q) signal. Decimation circuits 506 and 508 perform conventional signal decimation (reduction of the signal sampling rate) of both the I and Q signals, respectively. Conventional bit/symbol synchronizer circuit 509 provides a decimation control signal to each decimation circuit. The decimated I and Q signals form complex input signals to lower half-band complex filter 510 and upper half-band complex filter 512. Such complex filters are well known in the art. The output signals from each filter are filtered I and Q signals. Squaring circuits 514 and 516 square the filtered I and Q signals from filter 510. Squaring circuits 518 and 520 square the filtered I and Q signals from filter 512. The squared I and Q signals are then summed is summers 522 and 524. As such, lines 526 and 528 carry signals that are the "sum of the squares" of the filtered I and Q signals. Subtractor 130 subtracts the sum of the squares signals to form a difference signal. The difference signal is low pass filtered by filter 132 and scaled by scaling circuit 134 as described previously of my invention. Ultimately, the difference signal is used in the same manner as described above—to control the frequency of the LO signal in tuner 104.

Advantageously, complex filtering typically requires a signal sampling speed (processing speed) that is one-half or less than the processing speed used in real filtering. The particular processing speed used depends upon the decimation factor of the decimation circuits. In general, processing signals in the complex domain permits a decimation factor that is greater than, or equal to, two. However, under no circumstances should the decimation factor be so large that information is lost from the I and Q signals. Due to such slower processing speed, slower, less expensive processors can be utilized to implement my invention. However, when filtering complex signals with complex filters, four times as many multiply operations must be performed than are performed when filtering real signals with real filters. Nonetheless, for some applications of my invention, the tradeoff between slower processing speed and more multiply operations may be a worthwhile design choice to consider.

Additionally, the use of the matched Nyquist filters in series with the complex half-band filters provides an additional advantage over using only real half-band filters. Specifically, the matched Nyquist filters provide excellent adjacent channel RF signal rejection characteristics. As such, the transition bandwidth of each complex half-band filter does not have to be as steep as that of the real half-band filters, i.e., when the matched Nyquist filters are not used. Consequently, the complex half-band filters do not require as many taps and are easier to implement than the real half-band filters.

Although various embodiments which incorporate the teachings of the present invention have been shown and described in detail herein, those skilled in the art can readily devise many other varied embodiments that still incorporate these teachings.

I claim:

1. In a communications receiver having a tuner containing a frequency tunable local oscillator, and a demodulator, wherein the tuner mixes an output frequency of the local oscillator with a received signal to generate an intermediate frequency (IF) signal for application to the demodulator, the received and IF signals have an equal modulation bandwidth and first and second center frequencies, respectively, and wherein the first and second center frequencies are different, apparatus for generating a frequency control signal applied to the tuner for tuning the output frequency provided by the local oscillator in order to bring the second center frequency into coincidence with a pre-defined frequency for the IF signal, the apparatus comprising:

a first filter, connected to said tuner, for filtering the IF signal so as to produce a first filtered signal, said first filter having a first pre-defined frequency characteristic with a first bandwidth equivalent to a pre-defined upper portion of the modulation bandwidth and a third center frequency set to a frequency higher than the second center frequency;

a second filter, connected to said tuner, for filtering said IF signal so as to produce a second filtered signal, said second filter having a second pre-defined frequency characteristic with a second bandwidth equivalent to a pre-defined lower portion of the modulation bandwidth and a fourth center frequency set to a frequency below the second center frequency, wherein the upper and lower portions represent separate substantially non-overlapping portions of the modulation bandwidth;

means, connected to both said first and second filters, for producing a first tuning signal responsive to a difference, in terms of signal strength, between said first and second filtered signals;

a carrier recovery circuit, operative in conjunction with the demodulator, for producing a second tuning signal for adjusting, within a pre-defined capture range of the demodulator, the output frequency of the local oscillator so that the second center frequency coincides with the pre-defined frequency for the IF signal; and means, connected to both the first and second tuning signals and responsive to the demodulator, for selecting, as the frequency control signal, either the first or second tuning signals whenever the second center frequency lies respectively outside of or within the capture range of the demodulator whereby the first and second tuning signals function to provide coarse and fine tuning, respectively, of the output frequency of the local oscillator.

2. The apparatus of claim 1 wherein a passband response of either the first filter, the second filter or both is shaped to compensate for any asymmetries in a spectral response of said intermediate frequency signal.

3. The apparatus of claim 1 wherein said received signal is associated with a pre-defined channel within a plurality of channels wherein said first and second bandwidths and the third and fourth center frequencies are collectively defined by an expected frequency drift of signals contained in channels adjacent to said pre-defined channel.

4. The apparatus of claim 1 wherein said difference signal producing means comprises first means for squaring said first filtered signal so as to produce a first squared output signal; second means for squaring said second filtered signal so as to produce a second squared output signal; means, connected to said first and second squaring means, for subtracting said first squared output signal from said second squared output signal so as to form a difference output signal; and a low pass filter, connected to said subtracting means, for filtering the difference output signal to produce a difference signal, said difference signal representing a power difference between signals passing through said first and second filters.

5. The apparatus of claim 1 further comprising means, connected to said difference signal producing means, for scaling said difference signal to produce said first tuning signal.

6. The apparatus of claim 5 wherein said scaling means is a linear amplifier.

7. The apparatus of claim 5 wherein said scaling means is a look-up table containing pre-defined stored values for providing, in response to a value of said difference signal applied as an address thereto, one of said stored values as said first tuning signal.

8. The apparatus of claim 1 wherein said first and second filters are digital finite impulse response (FIR) filters.

9. The apparatus of claim 1 wherein said first and second filters are digital infinite impulse response (IIR) filters.

10. The apparatus of claim 1 wherein said first and second filters are complex filters.

11. In a communications receiver having a tuner containing a frequency tunable local oscillator, and a demodulator, wherein the tuner mixes an output frequency of the local oscillator with a received signal to generate an intermediate frequency (IF) signal for application to the demodulator, the received and IF signals have an equal modulation bandwidth and first and second center frequencies, respectively, and wherein the first and second center frequencies are different, apparatus for generating a frequency control signal applied to the tuner for tuning the output frequency provided by the local oscillator in order to bring the second center frequency of the intermediate frequency signal into coincidence with a pre-defined frequency for the IF signal, the apparatus comprising:

a first filter, connected to said tuner, for filtering the IF signal so as to produce a first filtered signal, said first filter having a first pre-defined frequency characteristic with a first bandwidth equivalent to approximately an upper half portion of the modulation bandwidth and a third center frequency set to a frequency higher than the second center frequency;

a second filter, connected to said tuner, for filtering said IF signal so as to produce a second filtered signal, said second filter having a second pre-defined frequency characteristic with a second bandwidth equivalent to approximately a lower half portion of the modulation bandwidth and a fourth center frequency set to a frequency below the second center frequency, wherein the upper and lower portions represent separate substantially non-overlapping portions of the modulation bandwidth;

means, connected to both said first and second filters, for producing a first tuning signal responsive to a difference, in terms of signal strength, between said first and second filtered signals;

a carrier recovery circuit, operative in conjunction with the demodulator, for producing a second tuning signal for adjusting, within a pre-defined capture range of the demodulator, the output frequency of the local oscillator so that the second center frequency coincides with the pre-defined frequency for the IF signal; and means, connected to both the first and second tuning signals and responsive to the demodulator, for selecting, as the frequency control signal, either the first or second tuning signals whenever the second center frequency lies respectively outside of or within the capture range of the demodulator whereby the first and second tuning signals function to provide coarse and fine tuning, respectively, of the output frequency of the local oscillator.

12. The apparatus of claim 11 wherein said difference signal producing means comprises first means for squaring said first filtered signal so as to produce a first squared output signal; second means for squaring said second filtered signal so as to produce a second squared output signal; means, connected to said first and second squaring means, for subtracting said first squared output signal from said second squared output signal so as to form a difference output signal; and a low pass filter, connected to said subtracting means, for filtering the difference output signal to produce a difference signal, said difference signal representing a power difference between signals passing through said first and second filters.

13. The apparatus of claim 12 further comprising means, connected to said difference signal producing means, for scaling said difference signal to produce said first tuning signal, wherein said scaling means is a linear amplifier.

14. The apparatus of claim 13 wherein said scaling means is a look-up table containing pre-defined stored values for providing, in response to a value of said difference signal applied as an address thereto, one of said stored values as said first tuning signal.

15. The apparatus of claim 11 wherein said first and second filters are digital finite impulse response (FIR) filters.

16. The apparatus of claim 11 wherein said first and second filters are digital infinite impulse response (IIR) filters.

17. The apparatus of claim 11 wherein said first and second filters are complex filters.

18. In a communications receiver having a tuner containing a frequency tunable local oscillator, and a demodulator, wherein the tuner mixes an output frequency of the local oscillator with a received signal to generate an intermediate frequency (IF) signal for application to the demodulator, the received and IF signals have an equal modulation bandwidth and first and second center frequencies, respectively, and wherein the first and second center frequencies are different, apparatus for generating a frequency control signal applied to the tuner for tuning the output frequency provided by the local oscillator in order to bring the second center frequency into coincidence with a pre-defined frequency for the IF signal, the apparatus comprising:

means, connected to the tuner, for digitizing said IF signal so as to produce a digitized IF signal;

means, connected to said digitizing means, for producing an in-phase (I) signal and a quadrature-phase (Q) signal from said digitized IF signal;

a first complex filter, connected to said producing means, for filtering said I and Q signals so as to produce a first filtered complex signal, said first complex filter having a first pre-defined frequency characteristic with a first bandwidth equivalent to a pre-defined upper portion of the modulation bandwidth and a third center frequency set to a frequency higher than the second center frequency;

a second complex filter, connected to said producing means, for filtering said I and Q signals so as to produce a second filtered complex signal, said second complex filter having a second pre-defined frequency characteristic with a second bandwidth equivalent to a pre-defined lower portion of the modulation bandwidth and a fourth center frequency set to a frequency below the second center frequency, wherein the upper and lower portions represent separate substantially non-overlapping portions of the modulation bandwidth;

means, connected to both said first and second complex filters, for producing a first tuning signal responsive to a difference, in terms of signal strength, between said first and second filtered complex signals;

a carrier recovery circuit, operative in conjunction with the demodulator, for producing a second tuning signal for adjusting, within a pre-defined capture range of the demodulator, the output frequency of the local oscillator so that the second center frequency coincides with the pre-defined frequency for the IF signal; and means, connected to both the first and second tuning signals and responsive to the demodulator, for selecting, as the frequency control signal, either the first or second tuning signals whenever the second center frequency lies respectively outside of or within the capture range of the demodulator whereby the first and second tuning signals function to provide coarse and fine tuning, respectively, of the output frequency of the local oscillator.

19. The apparatus of claim 18 wherein the bandwidth of each of said first and second complex filters is equivalent to approximately half of the modulation bandwidth.

20. The apparatus of claim 18 wherein said difference signal producing means comprises first means for squaring said first complex filtered signal so as to produce a first squared I output signal and a first squared Q output signal; second means for squaring said second complex filtered signal so as to produce a second squared I output signal and a second squared Q output; first means, connected to said first squaring means, for combining said first squared I and Q signals so as to produce a first sum signal; second means, connected to said second squaring means, for combining said second squared I and said second squared Q output signals so as to produce a second sum signal; means, connected to said first and second combining means, for subtracting said first sum signal from said second sum signal so as to produce a difference output signal; and a low pass filter, connected to said subtracting means, for filtering said difference output signal to produce the difference signal, said difference signal representing a power difference between signals passing through said first and second complex filters.

21. The apparatus of claim 20 further comprising means, connected to said difference signal producing means, for scaling said difference signal to produce said first tuning signal.

22. The apparatus of claim 21 wherein said scaling means is a linear amplifier.

* * * * *